US012412559B2

(12) United States Patent
Dai et al.

(10) Patent No.: US 12,412,559 B2
(45) Date of Patent: Sep. 9, 2025

(54) VOICE GENERATION FOR VIRTUAL CHARACTERS

(71) Applicant: Lemon Inc., Grand Cayman (KY)

(72) Inventors: Zeng Dai, Los Angeles, CA (US); Chen Sun, Los Angeles, CA (US); Ari Shapiro, Los Angeles, CA (US); Kin Chung Wong, Los Angeles, CA (US); Weishan Yu, Culver City, CA (US); August Yadon, Los Angeles, CA (US)

(73) Assignee: Lemon Inc., Grand Cayman (KY)

( * ) Notice: Subject to any disclaimer, the term of this patent is extended or adjusted under 35 U.S.C. 154(b) by 527 days.

(21) Appl. No.: 17/751,324

(22) Filed: May 23, 2022

(65) Prior Publication Data

US 2023/0377556 A1 Nov. 23, 2023

(51) Int. Cl.
*G10L 13/02* (2013.01)
*G06T 13/20* (2011.01)
*G06T 13/40* (2011.01)

(52) U.S. Cl.
CPC .......... *G10L 13/02* (2013.01); *G06T 13/205* (2013.01); *G06T 13/40* (2013.01)

(58) Field of Classification Search
CPC ..... G10L 13/02; G10L 21/003; G06T 13/205; G06T 13/40; H03G 9/005
See application file for complete search history.

(56) References Cited

U.S. PATENT DOCUMENTS 11,159,597 B2 * 10/2021 Ingel .................... H04L 65/765
11,468,616 B1 * 10/2022 Steptoe ................. G06V 40/16
2018/0336713 A1 * 11/2018 Avendano ............... G06T 13/40
2021/0224319 A1 * 7/2021 Ingel ..................... G06F 16/686
2022/0036915 A1 * 2/2022 Koretzky ................ G10L 25/54
2022/0301545 A1 9/2022 Kang et al.
(Continued)

FOREIGN PATENT DOCUMENTS

CN 112562705 A 3/2021
CN 113259701 A 8/2021
CN 113450759 A 9/2021
(Continued)

OTHER PUBLICATIONS

International Patent Application No. PCT/SG2023/050311; Int'l Search Report; dated Nov. 10, 2023; 4 pages.
(Continued)

*Primary Examiner* — Bhavesh M Mehta
*Assistant Examiner* — Jangwoen Lee
(74) *Attorney, Agent, or Firm* — BakerHostetler

(57) ABSTRACT

The present disclosure describes techniques of generating voices for virtual characters. A plurality of source sounds may be received. The plurality of source sounds may correspond to a plurality of frames of a video. The video may comprise a virtual character. The plurality of source sounds may be converted into a plurality of representations in a latent space using a first model. Each representation among the plurality of representations may comprise a plurality of parameters. The plurality of parameters may correspond to a plurality of sound features. A plurality of sounds may be generated in real time for the virtual character in the video based at least in part on modifying at least one of the plurality of parameters of each representation.

19 Claims, 9 Drawing Sheets

(56) References Cited

U.S. PATENT DOCUMENTS

2023/0039789 A1* 2/2023 Zhu .................. H04N 21/8146

FOREIGN PATENT DOCUMENTS

WO     WO-2020024582 A1 * 2/2020 ............. G10L 13/02
WO     WO 2022/025923 A1    2/2022

OTHER PUBLICATIONS

"Audio Classification Using CNN—An Experiment"; https://medium.com/x8-the-ai-community/audio-classification-using-cnn-coding-example-f9cbd272269e; Mar. 2019; accessed Nov. 28, 2022; 16 pages.

Hsu et al.; "A Detailed Look At CNN-based Approaches in Facial Landmark Detection"; Computer Vision and Pattern Recognition; arXiv.2005.08649; May 2020; 9 pages.

* cited by examiner

VOICE GENERATION FOR VIRTUAL CHARACTERS

BACKGROUND

Communication is increasingly being conducted using Internet-based tools. The Internet-based tools may be any software or platform. Existing social media platforms enable users to communicate with each other by sharing images, videos, and other information via static app or web pages. As communication devices, such as mobile phones, become more sophisticated, people continue to desire new ways for entertainment, social networking, and communication.

BRIEF DESCRIPTION OF THE DRAWINGS

The following detailed description may be better understood when read in conjunction with the appended drawings. For the purposes of illustration, there are shown in the drawings example embodiments of various aspects of the disclosure; however, the invention is not limited to the specific methods and instrumentalities disclosed.

DETAILED DESCRIPTION OF ILLUSTRATIVE EMBODIMENTS

Virtual characters (e.g., digital humans, avatars, simulated character etc.) are simulations of human beings on computers. Virtual characters are becoming increasingly popular in today's digital ecosystem. For example, many movies, television shows, simulations, games, virtual worlds, and industries utilize virtual characters in some manner. One important aspect of a virtual character is its voice. However, it may be difficult to generate the desired voice for a virtual character. For example, it may be difficult to generate a voice that has the desired characteristics, such as the desired volume, pace, pitch, pitch ratio, rate, rhythm, fluency, articulation, pronunciation, enunciation, tone, bypass, wet gain, dry gain, etc. Thus, improved techniques for virtual character voice generation are desirable.

Figure 1:
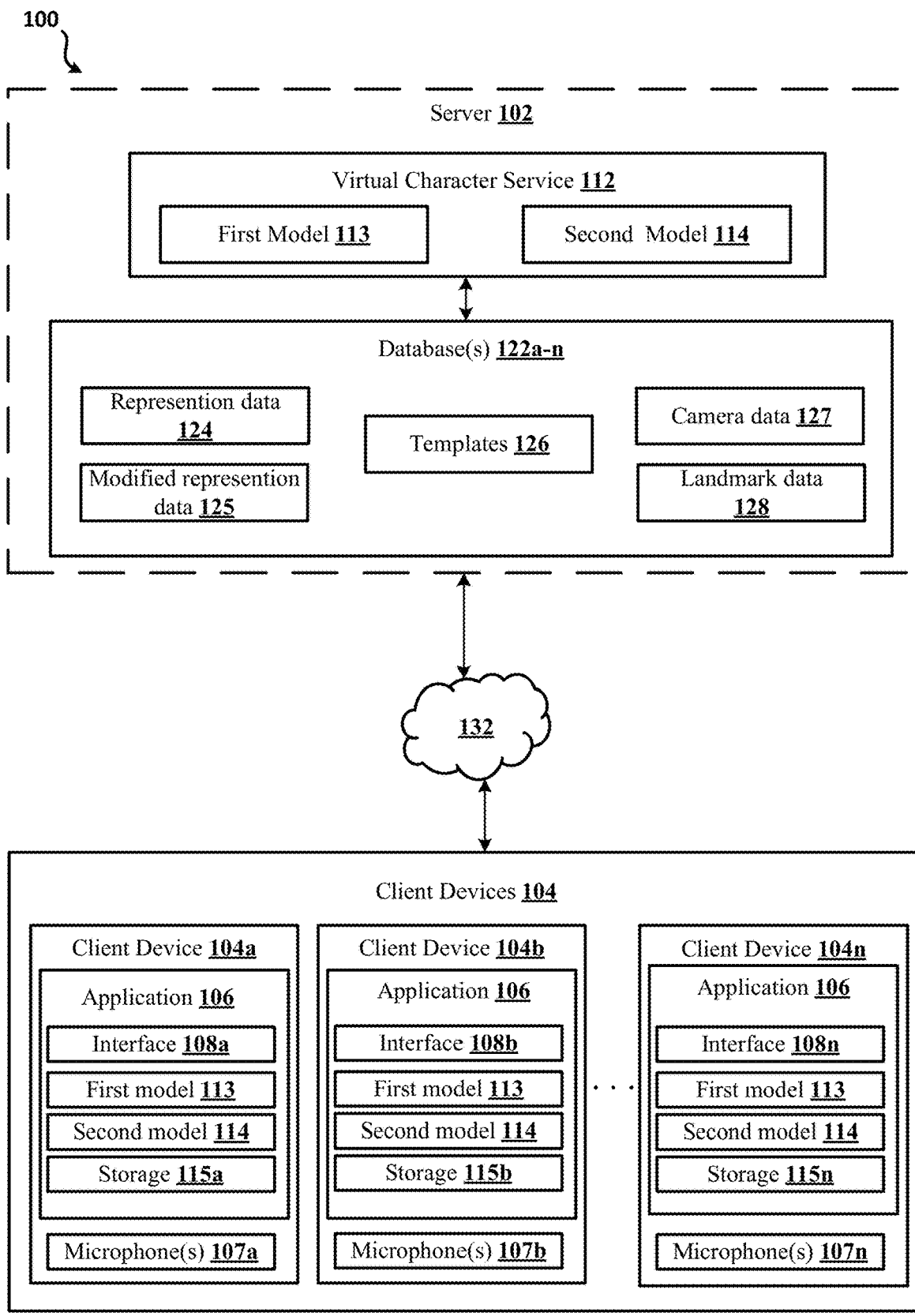
FIG. 1 illustrates an exemplary system for virtual character voice generation in accordance with the present disclosure.

FIG. 1 illustrates an exemplary system 100 for virtual character voice generation. The system 100 may comprise a server 102 and a plurality of client devices 104. The server 102 and the plurality of client devices 104a-n may communicate with each other via one or more networks 132.

The server 102 may be located at a data center, such as a single premise, or be distributed throughout different geographic locations (e.g., at several premises). The server 102 may provide the services via the one or more networks 120. The network 132 comprise a variety of network devices, such as routers, switches, multiplexers, hubs, modems, bridges, repeaters, firewalls, proxy devices, and/or the like. The network 132 may comprise physical links, such as coaxial cable links, twisted pair cable links, fiber optic links, a combination thereof, and/or the like. The network 132 may comprise wireless links, such as cellular links, satellite links, Wi-Fi links and/or the like.

The server 102 may comprise a plurality of computing nodes that host a variety of services. In an embodiment, the nodes host a virtual character service 112. The virtual character service 112 may comprise a content streaming service, such as an Internet protocol video streaming service. The virtual character service 112 may be configured to generate virtual characters. The virtual character service 112 may be configured to provide the generated virtual characters to the client devices 104a-n via the network 132. For example, the virtual character service 112 may comprise a video sharing service, a video hosting platform, a content distribution platform, a collaborative gaming platform, and/or the like.

The plurality of client devices 104 may comprise any type of computing device, such as a mobile device, a tablet device, laptop, a desktop computer, a smart television, or other smart device (e.g., smart watch, smart speaker, smart glasses, smart helmet), a gaming device, a set top box, digital streaming device, robot, and/or the like. The plurality of client devices 104 may be associated with one or more users. A single user may use one or more of the plurality of client devices 104 to access the server 102. The plurality of client devices 104 may travel to a variety of locations and use different networks to access the server 102.

In an embodiment, a client device 104 may comprise an application 106. The application 106 may be associated with the generation of virtual characters. For example, the application 106 may be configured to generate virtual characters locally on the client device 104. Alternatively, the application 106 may be configured to facilitate the generation of the virtual characters by the virtual character service 112. The application 106 outputs (e.g., display, render, present) content associated with the generation of virtual characters to a user associated with the client device 104 via an interface 108 of the client device 104. The content may comprise video, audio, graphics, textual data and/or the like. Each of the plurality of client devices 104 may comprise one or more microphones 107a-n. The microphone(s) 107a-n may be configured to capture audio. The audio may, for example, include audio spoken by the one or more users.

In embodiments, the virtual character service 112 and/or the application 106 is configured to generate voices for virtual characters. The virtual character for which the voice is generated may, for example, be included in a video that comprises a plurality of frames. In embodiments, the virtual character for which the voice is generated may be featured in a movie, television show, simulation, game, virtual world.

To generate voices for virtual characters, the virtual character service 112 and/or the application 106 may receive source sounds, such as from the client devices 104. For example, the source sounds may be captured by the one or more microphones 107a-n. The virtual character service 112 and/or the application 106 may generate voices for virtual characters based on the source sounds. For example, if a source sound includes audio of a user saying, "Hello my name is Kat," the virtual character service 112 and/or the application 106 may generate a voice for a virtual character, the voice also saying, "Hello my name is Kat." However, despite saying the same words as the source audio, the voice for the virtual character may sound different than the user's voice. In certain embodiments, the voices for the virtual characters may be generated in real time or near-real time as the source sounds are received or captured.

In embodiments, the virtual character service 112 and/or the application 106 comprises a first model 113. The first model 113 may be configured to convert source sounds into a plurality of representations in a latent space. Each representation among the plurality of representations may comprise a plurality of parameters, such as multidimensional parameters. The plurality of parameters may each correspond to one of a plurality of sound features. By way of example and without limitation, the plurality of sound features may include volume, pace, pitch, pitch ratio, rate, rhythm, fluency, articulation, pronunciation, enunciation, tone, bypass, wet gain, dry gain, etc. For example, the first model 113 may be configured to process sound at a certain frequency (e.g., 30 FPS). Each frame may be represented by a representation of the plurality of representations. The plurality of representations may be stored as representation data 124 in the databases 122a-n and/or the local storage 115a.

In embodiments, the first model 113 includes an encoder. If the first model 113 includes an encoder 113, the first model 113 may encode the source sounds to the plurality of representations (each of which comprises the plurality of parameters) through a trained artificial intelligence (AI) model.

In embodiments, the plurality of parameters can be tweaked or modified by a user. For example, the user that generated the source sound may want to tweak or modify the parameters in order to generate a desired voice for a virtual character. The desired voice may have, for example, one or more desired characteristics, such as a desired volume, pace, pitch, pitch ratio, rate, rhythm, fluency, articulation, pronunciation, enunciation, tone, bypass, wet gain, dry gain, etc. Information indicative of the plurality of parameters may be presented to a user, such as via the interface 108. The user may modify the plurality of parameters via the interface 108. For example, if the desired voice has a very high pitch, the user may tweak or modify the parameter corresponding to pitch accordingly. If one or more of the plurality of parameters are modified, the modified plurality of representations may be stored as modified representation data 125 in the databases 122a-n and/or the local storage 115a.

In embodiments, the databases 122a-n and/or the local storage 115a comprise one or more templates 126. The templates 126 may indicate predefined parameters for a user. For example, a "woman" template may indicate the parameters that can change a man's voice to woman's voice. Other examples of templates include "child," "man," "alien," "demon," "cartoon character," etc. A user may select one or more templates to apply to a representation. For example, a user may select a "woman" template to apply to a representation. If a user selects one or more templates to apply to a source sound, the predefined parameters associated with the one or more selected templates may automatically be applied to the representation. In certain embodiments, the user may be able to further modify the parameters after applying the one or more templates to the representation.

In certain embodiments, the user can customize the parameter modifications by providing two different sounds or voices. For example, the user can provide a woman sound and man sound recording by reading the same sentence. The two inputs may be analyzed, and the best parameters may be recommended for the voice change. The user may be able to further modify the parameters.

In embodiments, the virtual character service 112 and/or the application 106 is configured to generate a plurality of sounds in real time for a virtual character based at least in part on the modified representations. For example, the first model 113 may comprise a decoder. The decoder may be configured to decode the modified representations to the sound signal (i.e., the virtual character voice). The sound signal may be output, such as via a speaker of the client device 104. The sound signal may be output at the same frame as the corresponding source sound.

In certain embodiments, the virtual character service 112 and/or the application 106 comprises a second model 114. The second model 114 may be configured to receive, as input, user camera data 127. The camera data 127 may include one or more frames (i.e., images) captured by a camera of the client device 104. The camera data 127 may be stored in the databases 122a-n and/or in local storage 115a-n. The second model 114 may utilize the user camera input to analyze the skeleton of a user's body and his or her facial landmarks etc. via one or more AI model powered algorithms. The input of second model 114 may be image(s), the output may be the body and/or facial landmark coordinates 128. These body and/or facial landmark coordinates 128 may be utilized to drive the bodily and facial movements of a virtual character. The body and/or facial landmark coordinates 128 may be stored in the databases 122a-n and/or the local storage 115a.

The second model 114 may, in addition to receiving the user camera input, receive the source sounds discussed above as input. The source sounds may be utilized to help improve the stability of the facial animation of the virtual character. For example, this may be especially useful when the user's face is not facing the camera, is blocked by a hand, etc. To utilize the source sounds as an extra dimension input, an encoder may be utilized to convert the current time window's sound input to an image. The extra image layer may be added to the current camera image frame as extra input for training the second model 114. Training can be performed in accordance with a traditional convolutional neural network (CNN) model training process.

Figure 2:
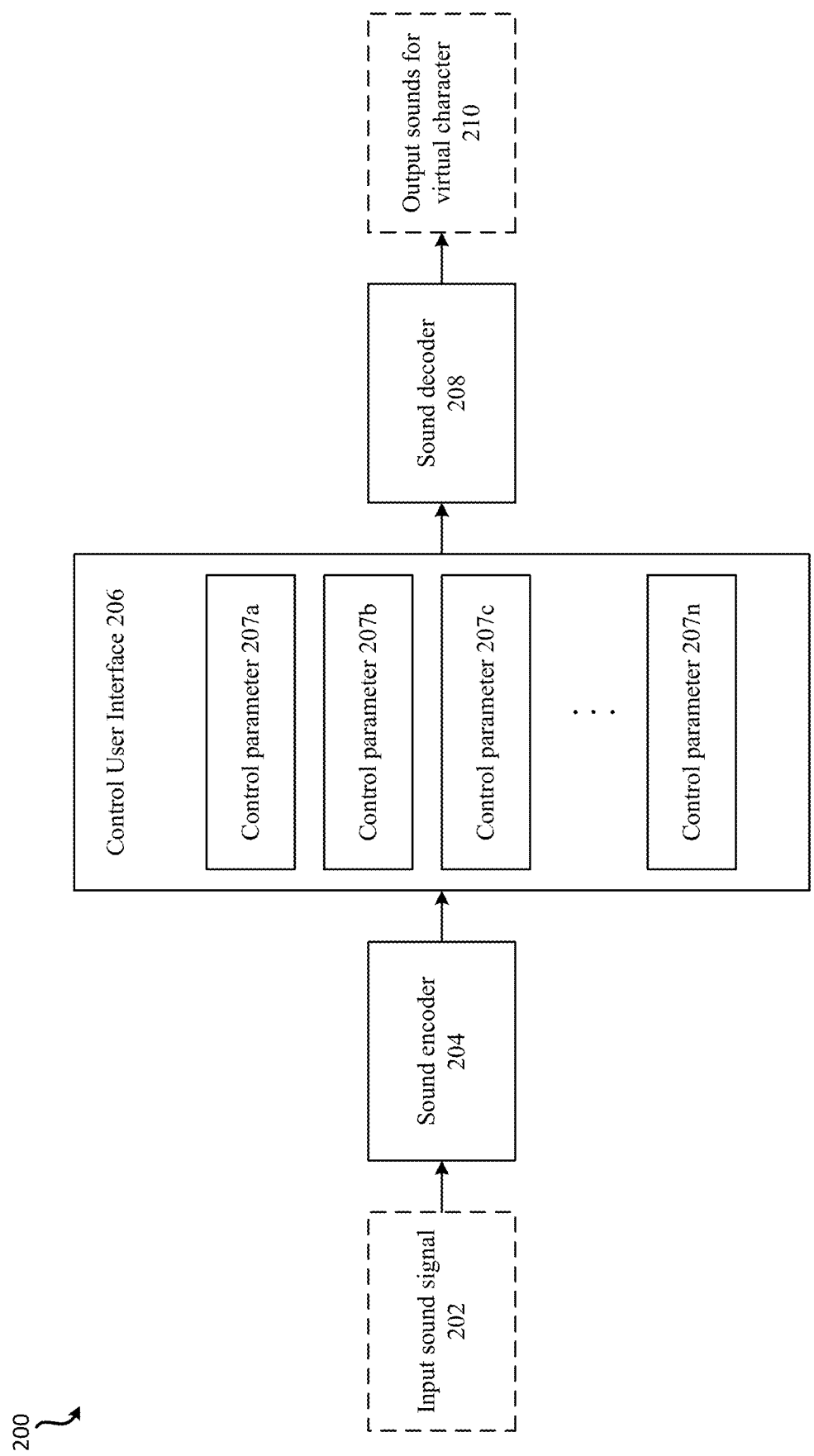
FIG. 2 illustrates an exemplary framework for virtual character voice generation in accordance with the present disclosure.

FIG. 2 illustrates an exemplary framework 200 for virtual character voice generation. The framework 200 includes an encoder 204, a control user interface 206, and a decoder 208. A sound signal 202 may be input into the sound encoder 204. The sound signal may, for example, be a source sound received from a client device. For example, the source sound may be captured by the one or more microphones of the client devices.

The sound encoder 204 may be configured to convert the input sound signal 202 into a plurality of representations in a latent space. Each representation among the plurality of representations may comprise a plurality of parameters 207a-n, such as multidimensional parameters. The plurality of parameters 207a-n may each correspond to one of a plurality of sound features. By way of example and without limitation, the plurality of sound features may include volume, pace, pitch, pitch ratio, rate, rhythm, fluency, articulation, pronunciation, enunciation, tone, bypass, wet gain, dry gain, etc. For example, the encoder 204 may encode the input sound signal 202 to the plurality of representations (each of which comprises the plurality of parameter 207a-n s) through a trained artificial intelligence (AI) model.

The plurality of parameters 207a-n can be tweaked or modified by a user via the control user interface 206. For example, the user that generated the source sound may want to tweak or modify the parameters 207a-n in order to generate a desired voice for a virtual character. The desired voice may have, for example, one or more desired characteristics, such as a desired volume, pace, pitch, rate, rhythm, fluency, articulation, pronunciation, enunciation, tone, etc. Information indicative of the plurality of parameters 207a-n may be presented to a user, such as via the interface 206.

Figure 3:
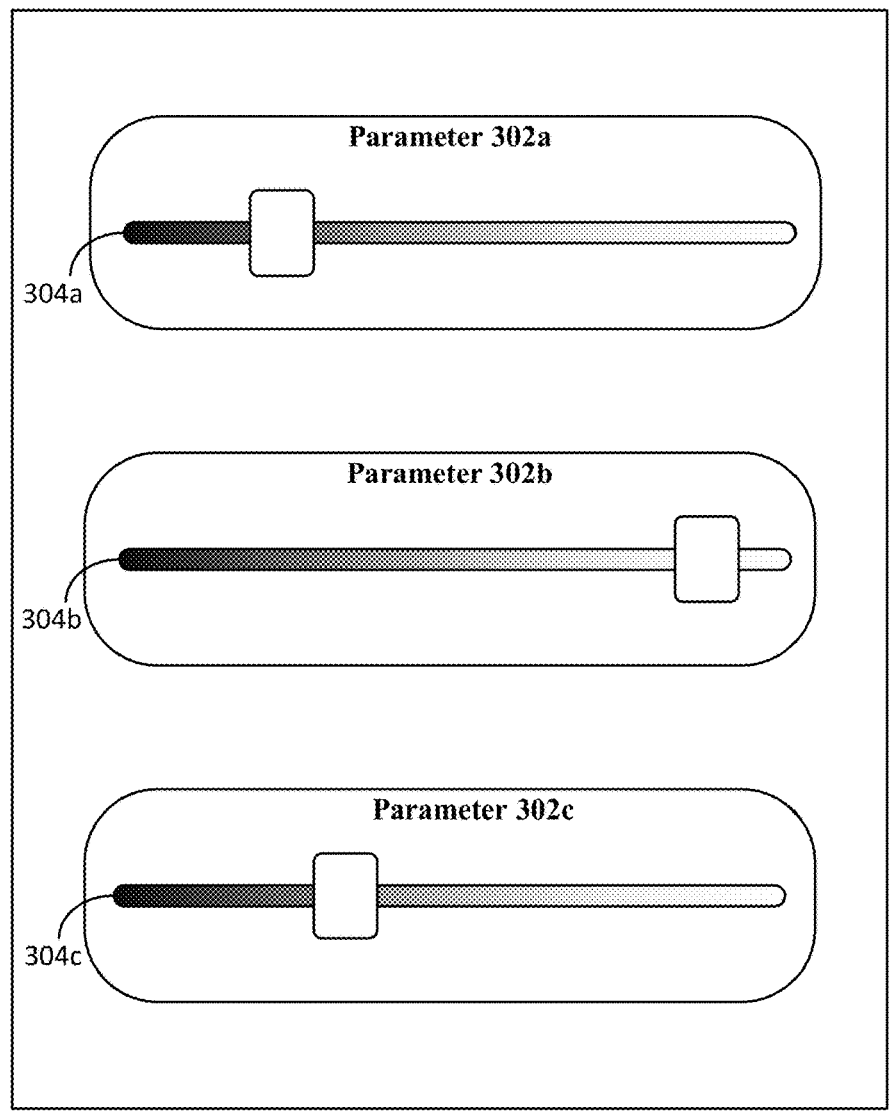
FIG. 3 illustrates an exemplary user interface for virtual character voice generation in accordance with the present disclosure.

FIG. 3 illustrates an exemplary user interface (UI) 300 for virtual character voice generation. In particular, the UI 300 may be utilized to modify a plurality of parameters in order to generate a desired voice for a virtual character. For example, a user may modify a first parameter 302a by adjusting a first slider 304a to a desired position on the UI 300. The first parameter 302a may be any voice parameter, including but not limited to volume, pace, pitch, pitch ratio, rate, rhythm, fluency, articulation, pronunciation, enunciation, tone, bypass, wet gain, or dry gain. Likewise, a user may modify a second parameter 302b by adjusting a second slider 304b to a desired position on the UI 300. The second parameter 302b may be any voice parameter, including but not limited to volume, pace, pitch, pitch ratio, rate, rhythm, fluency, articulation, pronunciation, enunciation, tone, bypass, wet gain, or dry gain. Additionally, a user may modify a third parameter 302c by adjusting a third slider 304c to a desired position on the UI 300. The third parameter 302c may be any voice parameter, including but not limited to volume, pace, pitch, pitch ratio, rate, rhythm, fluency, articulation, pronunciation, enunciation, tone, bypass, wet gain, or dry gain.

In embodiments, a user may select one or more templates to apply to a source sound. The template(s) may indicate predefined parameters, and such predefined parameters may automatically be applied to the representation. For example, the sliders 304a-c may be automatically adjusted to positions corresponding to the selected template(s). In certain embodiments, the user may be able to further modify the sliders 304a-c after the template(s) have been applied.

Referring back to FIG. 2, a plurality of sounds may be generated in real time for a virtual character based at least in part on the modified representations. For example, the decoder 208 may be configured to decode the modified representations to the sound signal 210 (i.e., the virtual character voice). The sound signal 210 may be output, such as via a speaker of the client device 104. The sound signal 210 may be output at the same frame as the corresponding source sound.

Figure 4:
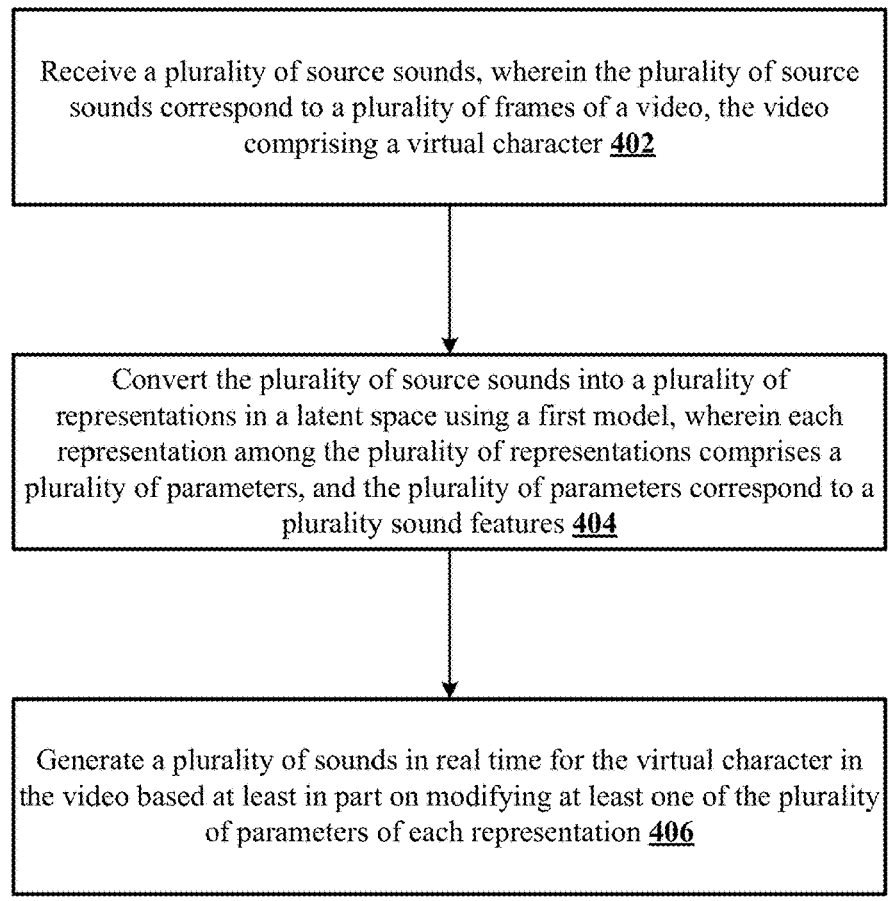
FIG. 4 illustrates an example process for virtual character voice generation in accordance with the present disclosure.

FIG. 4 illustrates an example process 400 performed by one or more components shown in the diagram 100. For example, the process 400 may be performed, at least in part, by the server 102 and/or the client devices 104. The process 400 may be performed to generate a voice for a virtual character. Although depicted as a sequence of operations in FIG. 4, those of ordinary skill in the art will appreciate that various embodiments may add, remove, reorder, or modify the depicted operations.

At 402, a plurality of source sounds may be received. The plurality of source sounds may correspond to a plurality of frames of a video. The video may comprise a virtual character. For example, the source sounds may be captured by the one or more microphones of the client devices 104. The source sounds may include audio of a user saying words or phrases that the user wants a virtual character to say. For example, if a user wants a virtual character to say, "Hello my name is Kat," the user may speak into the microphone(s) of his or her client device 104 and say, "Hello my name is Kat."

A voice for the virtual characters may be generated based on the source sounds. At 404, the plurality of source sounds may be converted into a plurality of representations in a latent space using a first model. Each representation among the plurality of representations may comprise a plurality of parameters. The plurality of parameters may correspond to a plurality of sound features. By way of example and without limitation, the plurality of sound features may include volume, pace, pitch, pitch ratio, rate, rhythm, fluency, articulation, pronunciation, enunciation, tone, bypass, wet gain, dry gain, etc.

The plurality of parameters can be tweaked or modified by a user. For example, the user that generated the source sound may want to tweak or modify the parameters in order to generate a desired voice for a virtual character. The desired voice may have, for example, one or more desired characteristics, such as a desired volume, pace, pitch, pitch ratio, rate, rhythm, fluency, articulation, pronunciation, enunciation, tone, bypass, wet gain, dry gain, etc. Information indicative of the plurality of parameters may be presented to a user, such as via an interface. The user may modify the plurality of parameters via the interface.

At 406, a plurality of sounds may be generated in real time for the virtual character in the video based at least in part on modifying at least one of the plurality of parameters of each representation. For example, if the parameters were modified so that the pitch of the source sound was increased, the plurality of sounds generated in real time for the virtual character may have a higher pitch than the source sound. The plurality of sounds may be used as a voice for the virtual character. Any number of parameters may have been modified. As a result, the plurality of sounds generated in real time for the virtual character may sound substantially different from the source sound. For example, the source sound may have featured a man talking, and the plurality of sounds generated in real time for the virtual character may sound like a small child, a woman, a cartoon character, etc. is talking.

Figure 5:
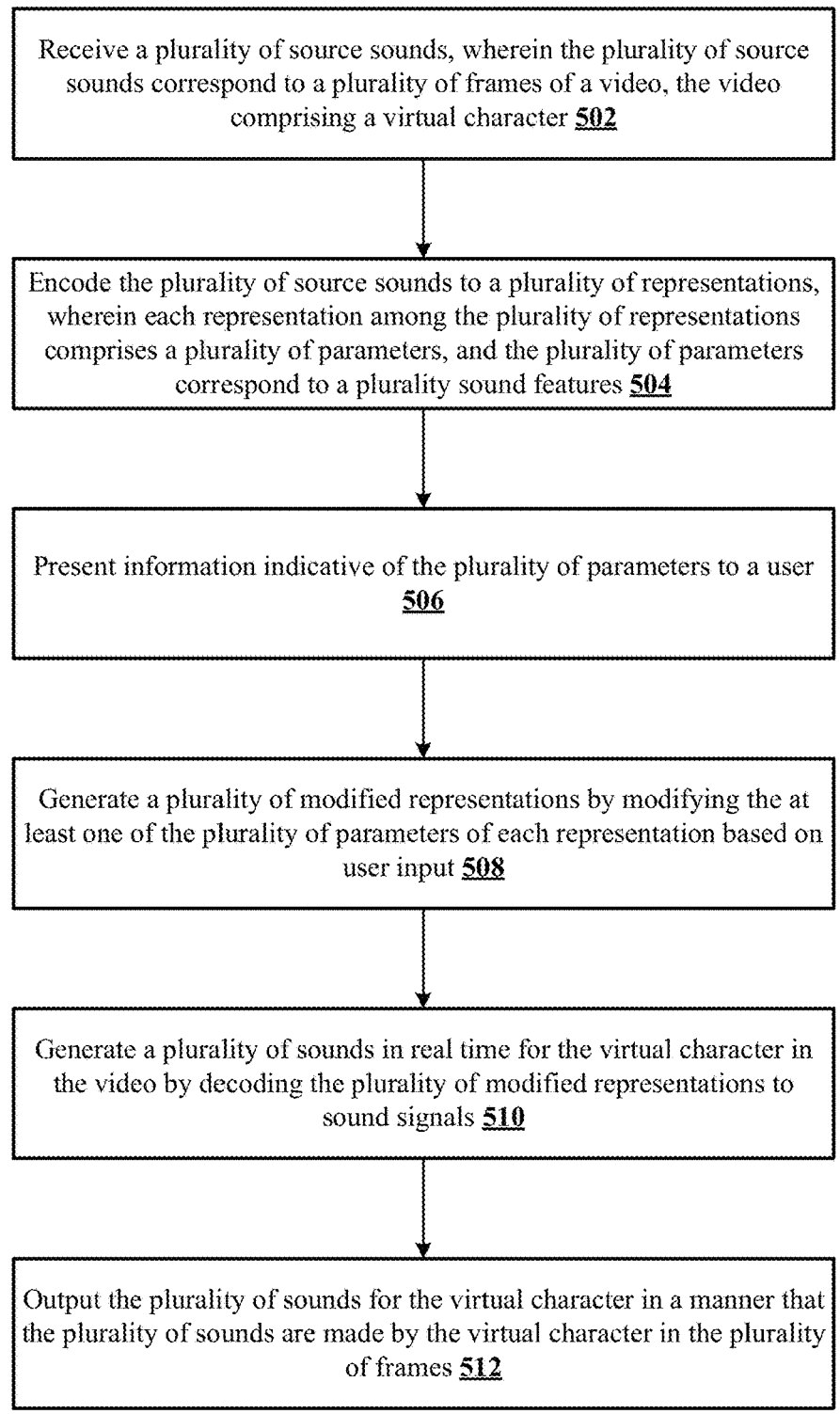
FIG. 5 illustrates another example process for virtual character voice generation in accordance with the present disclosure.

FIG. 5 illustrates an example process 500 performed by one or more components shown in the diagram 100. For example, the process 500 may be performed, at least in part, by the server 102 and/or the client devices 104. The process 500 may be performed to generate a voice for a virtual character. Although depicted as a sequence of operations in FIG. 5, those of ordinary skill in the art will appreciate that various embodiments may add, remove, reorder, or modify the depicted operations.

At 502, a plurality of source sounds may be received. The plurality of source sounds may correspond to a plurality of frames of a video. The video may comprise a virtual character. For example, the source sounds may be captured by the one or more microphones of the client devices 104. The source sounds may include audio of a user saying words or phrases that the user wants a virtual character to say. For example, if a user wants a virtual character to say, "Hello my name is Kat," the user may speak into the microphone(s) of his or her client device 104 and say, "Hello my name is Kat."

A voice for the virtual characters may be generated based on the source sounds. At 504, the plurality of source sounds may be encoded to a plurality of representations. Each representation among the plurality of representations may comprise a plurality of parameters. The plurality of parameters may correspond to a plurality of sound features. By way of example and without limitation, the plurality of sound features may include volume, pace, pitch, pitch ratio, rate, rhythm, fluency, articulation, pronunciation, enunciation, tone, bypass, wet gain, dry gain, etc. For example, the source sounds may be encoded to the plurality of representations (each of which comprises the plurality of parameters) through a trained AI model.

The plurality of parameters can be tweaked or modified by a user. For example, the user that generated the source sound may want to tweak or modify the parameters in order to generate a desired voice for a virtual character. At 506, information indicative of the plurality of parameters may be presented to a user. For example, a UI, such as the UI 300, may be presented to the user. The user may utilize the UI to modify one or more of the plurality of parameters in order to generate a desired voice for a virtual character.

For example, a user may modify a first parameter by adjusting a first slider to a desired position on the UI. The first parameter may be any voice parameter, including but not limited to volume, pace, pitch, pitch ratio, rate, rhythm, fluency, articulation, pronunciation, enunciation, tone, bypass, wet gain, or dry gain. Likewise, a user may modify a second parameter by adjusting a second slider to a desired position on the UI. The second parameter may be any voice parameter, including but not limited to volume, pace, pitch, pitch ratio, rate, rhythm, fluency, articulation, pronunciation, enunciation, tone, bypass, wet gain, or dry gain. Additionally, a user may modify a third parameter by adjusting a third slider to a desired position on the UI. The third parameter may be any voice parameter, including but not limited to volume, pace, pitch, pitch ratio, rate, rhythm, fluency, articulation, pronunciation, enunciation, tone, bypass, wet gain, or dry gain.

At 508, a plurality of modified representations may be generated by modifying the at least one of the plurality of parameters of each representation based on user input. For example, the plurality of modified representations may reflect any modifications, if any, that the user made to the plurality of parameters. At 510, a plurality of sounds may be generated in real time for the virtual character in the video by decoding the plurality of modified representations to sound signals. A decoder may be configured to decode the modified representations to a sound signal (i.e., the virtual character voice). The sound signal may be output, such as via a speaker of the client device. The sound signal may be output at the same frame as the corresponding source sound. At 512, the plurality of sounds for the virtual character may be output in a manner that the plurality of sounds are made by the virtual character in the plurality of frames. For example, it may appear like the virtual character is speaking. The plurality of sounds may include the words that it looks like the virtual character is saying.

Figure 6:
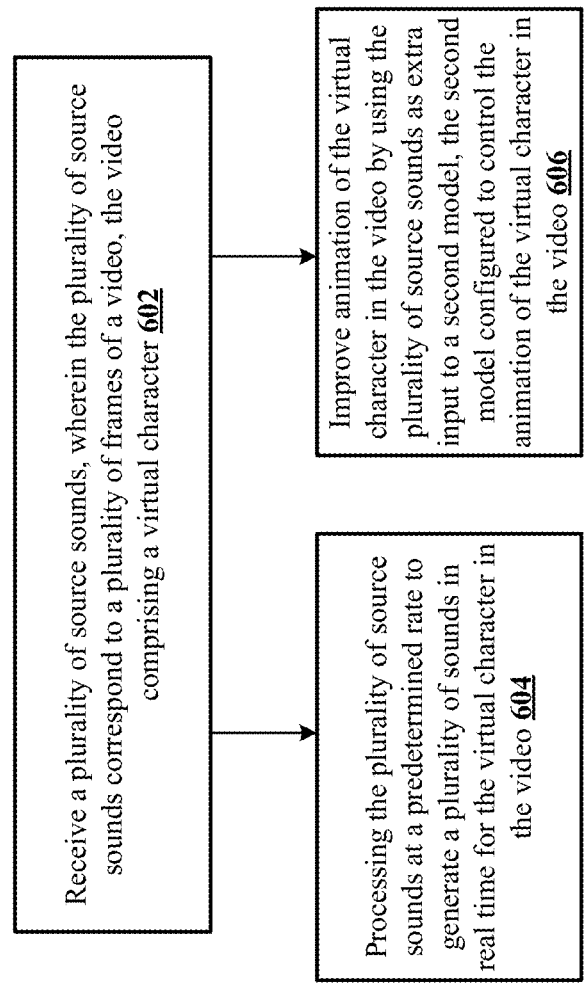
FIG. 6 illustrates another example process for virtual character voice generation in accordance with the present disclosure.

FIG. 6 illustrates an example process 600 performed by one or more components shown in the diagram 100. For example, the process 600 may be performed, at least in part, by the server 102 and/or the client devices 104. The process 600 may be performed to generate a voice for a virtual character. Although depicted as a sequence of operations in FIG. 6, those of ordinary skill in the art will appreciate that various embodiments may add, remove, reorder, or modify the depicted operations.

At 602, a plurality of source sounds may be received. The plurality of source sounds may correspond to a plurality of frames of a video. The video may comprise a virtual character. For example, the source sounds may be captured by the one or more microphones of the client devices 104.

The source sounds may include audio of a user saying words or phrases that the user wants a virtual character to say. For example, if a user wants a virtual character to say, "Hello my name is Kat," the user may speak into the microphone(s) of his or her client device 104 and say, "Hello my name is Kat." The method 600 may proceed to step 604 or step 606.

The plurality of source sounds may be utilized to generate voices for virtual characters. The virtual character for which the voice is generated may, for example, be included in a video that comprises a plurality of frames. At 604, the plurality of source sounds may be processed at a predetermined rate to generate a plurality of sounds in real time for the virtual character in the video.

For example, processing the plurality of source sounds at the predetermined rate may comprise converting the source sounds into a plurality of representations in a latent space. Each representation among the plurality of representations may comprise a plurality of parameters, such as multidimensional parameters. The plurality of parameters may each correspond to one of a plurality of sound features. By way of example and without limitation, the plurality of sound features may include volume, pace, pitch, pitch ratio, rate, rhythm, fluency, articulation, pronunciation, enunciation, tone, bypass, wet gain, dry gain, etc. Generating voices for a virtual character is a real time running process. The plurality of source sounds corresponding to the plurality of video frames are processed at a certain frequency. For example, the source sounds may be processed at 30 frames per second (FPS).

The plurality of parameters can be tweaked or modified by a user. For example, the user that generated the source sound may want to tweak or modify the parameters in order to generate a desired voice for a virtual character. The desired voice may have, for example, one or more desired characteristics, such as a desired volume, pace, pitch, pitch ratio, rate, rhythm, fluency, articulation, pronunciation, enunciation, tone, bypass, wet gain, dry gain, etc.

A plurality of sounds may be generated in real time for a virtual character based at least in part on the modified representations. The plurality sounds may be output, such as via a speaker of the client device. The sound signal may be output at the same frame as the corresponding source sound.

A second model may be configured to receive, as input, user camera data. The camera data may include one or more frames (i.e., images) captured by a camera of the client device. The camera data may be stored in the databases and/or in local storage. The second model may utilize the user camera input to analyze the skeleton of a user's body and his or her facial landmarks etc. via one or more AI model powered algorithms. The input of second model may be image(s), the output may be the body and/or facial landmark coordinates. These body and/or facial landmark coordinates may be utilized to drive the bodily and facial movements of a virtual character.

The second model may, in addition to receiving the user camera input, receive the source sounds discussed above as input. At 606, animation of the virtual character in the video may be improved by using the plurality of source sounds as extra input to a second model, the second model configured to control the animation of the virtual character in the video. The source sounds may be utilized to help improve the stability of the facial animation of the virtual character. For example, this may be especially useful when the user's face is not facing the camera, is blocked by a hand, etc. To utilize the source sounds as an extra dimension input, an encoder may be utilized to convert the current time window's sound input to an image. The extra image layer may be added to the current camera image frame as extra input for training the second model. Training can be performed in accordance with a traditional convolutional neural network (CNN) model training process.

Figure 7:
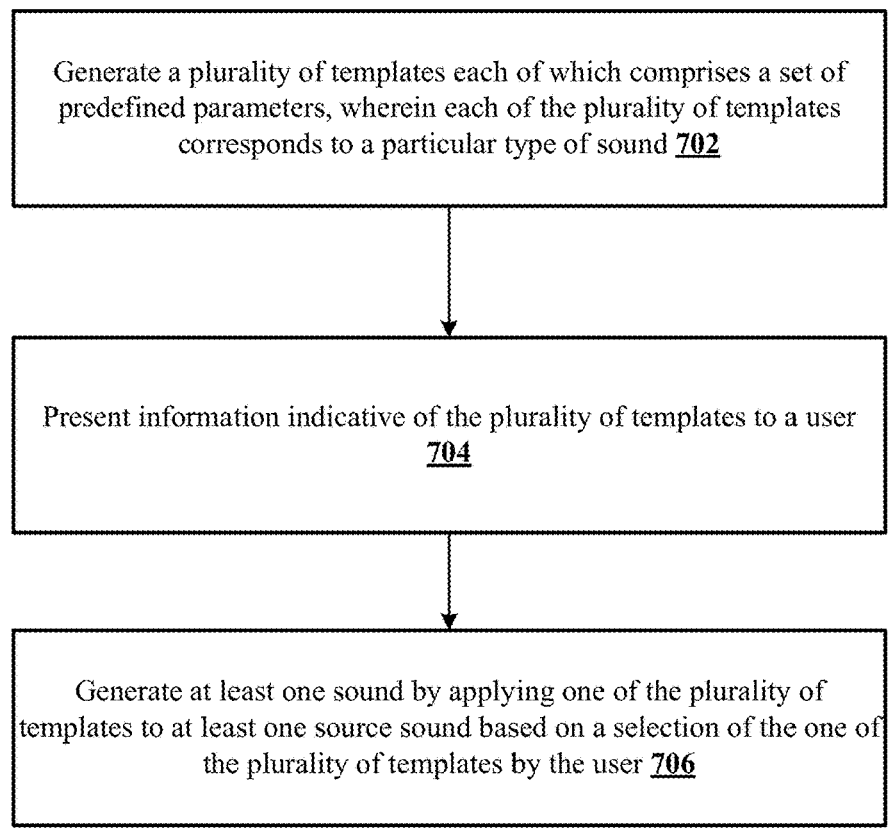
FIG. 7 illustrates another example process for virtual character voice generation in accordance with the present disclosure.

FIG. 7 illustrates an example process 700 performed by one or more components shown in the diagram 100. For example, the process 700 may be performed, at least in part, by the server 102 and/or the client devices 104. The process 700 may be performed to generate a voice for a virtual character. Although depicted as a sequence of operations in FIG. 7, those of ordinary skill in the art will appreciate that various embodiments may add, remove, reorder, or modify the depicted operations.

Templates may indicate predefined voice parameters for a user. At 702, a plurality of templates may be generated, each of which comprises a set of predefined parameters, wherein each of the plurality of templates corresponds to a particular type of sound or voice. For example, a "woman" template may indicate the parameters that can change a man's voice to woman's voice. Other examples of templates include "child," "man," "alien," "demon," "cartoon character," etc. A user may select one or more templates to apply to a representation.

At 704, information indicative of the plurality of templates may be presented to a user. For example, information indicative of the plurality of templates may be presented to a user via an interface. The user may be able to select one or more templates that corresponds to a desire voice for a virtual character. For example, if the user wants the virtual character to have a female voice, the user may select a "woman" template.

At 706, at least one sound may be generated by applying one of the plurality of templates to at least one source sound based on a selection of the one of the plurality of templates by the user. For example, if a user selects one or more templates to apply to a source sound, the predefined parameters associated with the one or more selected templates may automatically be applied to the representation associated with the source sound. In certain embodiments, the user may be able to further modify the parameters after applying the one or more templates to the representation.

Figure 8:
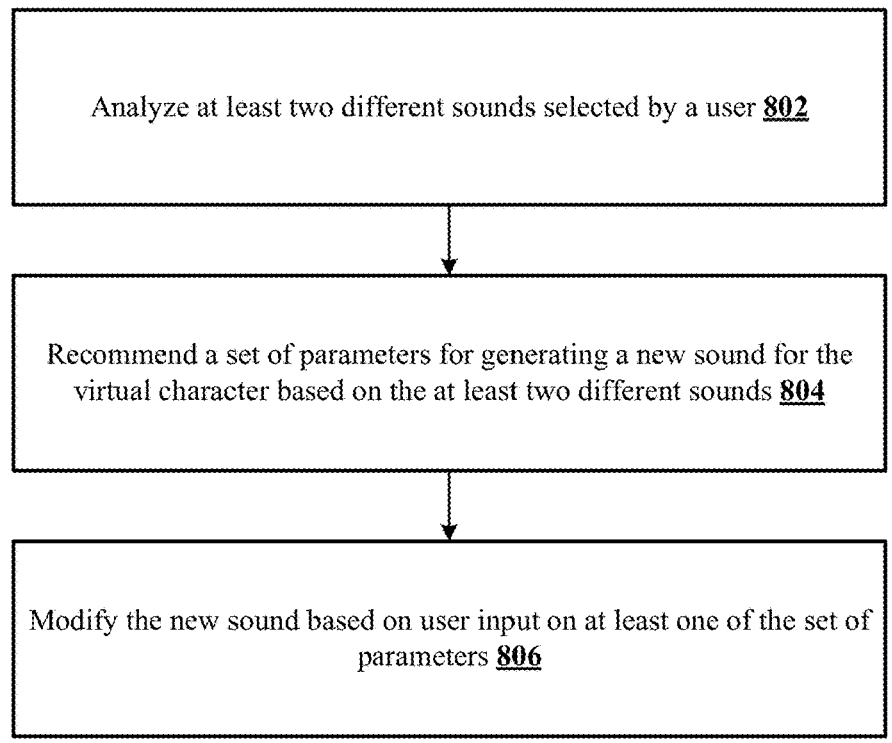
FIG. 8 illustrates another example process for virtual character voice generation in accordance with the present disclosure.

FIG. 8 illustrates an example process 800 performed by one or more components shown in the diagram 100. For example, the process 800 may be performed, at least in part, by the server 102 and/or the client devices 104. The process 800 may be performed to generate a voice for a virtual character. Although depicted as a sequence of operations in FIG. 8, those of ordinary skill in the art will appreciate that various embodiments may add, remove, reorder, or modify the depicted operations.

As described above, a user can customize parameter modifications by providing two different sounds or voices. At 802, at least two different sounds selected by a user may be analyzed. At 804, a set of parameters for generating a new sound for the virtual character may be generated based on the at least two different sounds. For example, the two inputs may be analyzed, and the best parameters may be recommended for the voice change. The user may be able to further modify the parameters. At 806, the new sound may be modified based on user input on at least one of the set of parameters.

Figure 9:
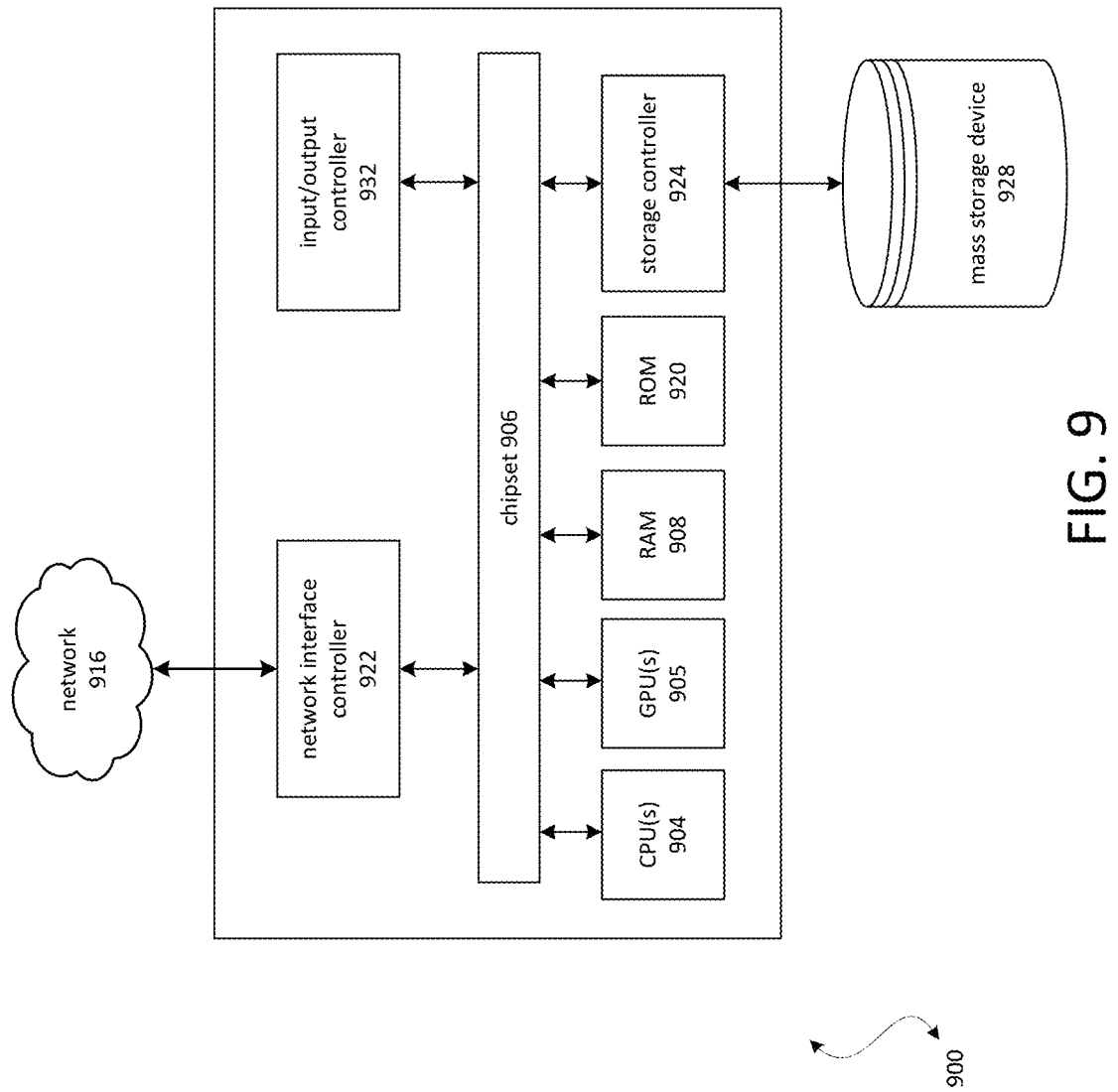
FIG. 9 illustrates an example computing device which may be used to perform any of the techniques disclosed herein.

FIG. 9 illustrates a computing device that may be used in various aspects, such as the services, networks, modules, and/or devices depicted in FIGS. 1-2. The computer architecture shown in FIG. 9 shows a conventional server computer, workstation, desktop computer, laptop, tablet, network appliance, PDA, e-reader, digital cellular phone, or other computing node, and may be utilized to execute any aspects of the computers described herein, such as to implement the methods described herein.

The computing device 900 may include a baseboard, or "motherboard," which is a printed circuit board to which a multitude of components or devices may be connected by way of a system bus or other electrical communication paths. One or more central processing units (CPUs) 904 may operate in conjunction with a chipset 906. The CPU(s) 904 may be standard programmable processors that perform arithmetic and logical operations necessary for the operation of the computing device 900.

The CPU(s) 904 may perform the necessary operations by transitioning from one discrete physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits including registers, adders-subtractors, arithmetic logic units, floating-point units, and the like.

The CPU(s) 904 may be augmented with or replaced by other processing units, such as GPU(s) 905. The GPU(s) 905 may comprise processing units specialized for but not necessarily limited to highly parallel computations, such as graphics and other visualization-related processing.

A chipset 906 may provide an interface between the CPU(s) 904 and the remainder of the components and devices on the baseboard. The chipset 906 may provide an interface to a random-access memory (RAM) 908 used as the main memory in the computing device 900. The chipset 906 may further provide an interface to a computer-readable storage medium, such as a read-only memory (ROM) 920 or non-volatile RAM (NVRAM) (not shown), for storing basic routines that may help to start up the computing device 900 and to transfer information between the various components and devices. ROM 920 or NVRAM may also store other software components necessary for the operation of the computing device 900 in accordance with the aspects described herein.

The computing device 900 may operate in a networked environment using logical connections to remote computing nodes and computer systems through local area network (LAN). The chipset 906 may include functionality for providing network connectivity through a network interface controller (NIC) 922, such as a gigabit Ethernet adapter. A NIC 922 may be capable of connecting the computing device 900 to other computing nodes over a network 916. It should be appreciated that multiple NICs 922 may be present in the computing device 900, connecting the computing device to other types of networks and remote computer systems.

The computing device 900 may be connected to a mass storage device 928 that provides non-volatile storage for the computer. The mass storage device 928 may store system programs, application programs, other program modules, and data, which have been described in greater detail herein. The mass storage device 928 may be connected to the computing device 900 through a storage controller 924 connected to the chipset 906. The mass storage device 928 may consist of one or more physical storage units. The mass storage device 928 may comprise a management component 99. A storage controller 924 may interface with the physical storage units through a serial attached SCSI (SAS) interface, a serial advanced technology attachment (SATA) interface, a fiber channel (FC) interface, or other type of interface for physically connecting and transferring data between computers and physical storage units.

The computing device 900 may store data on the mass storage device 928 by transforming the physical state of the physical storage units to reflect the information being stored. The specific transformation of a physical state may depend on various factors and on different implementations of this description. Examples of such factors may include, but are not limited to, the technology used to implement the physical storage units and whether the mass storage device 928 is characterized as primary or secondary storage and the like.

For example, the computing device 900 may store information to the mass storage device 928 by issuing instructions through a storage controller 924 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computing device 900 may further read information from the mass storage device 928 by detecting the physical states or characteristics of one or more particular locations within the physical storage units.

In addition to the mass storage device 928 described above, the computing device 900 may have access to other computer-readable storage media to store and retrieve information, such as program modules, data structures, or other data. It should be appreciated by those skilled in the art that computer-readable storage media may be any available media that provides for the storage of non-transitory data and that may be accessed by the computing device 900.

By way of example and not limitation, computer-readable storage media may include volatile and non-volatile, transitory computer-readable storage media and non-transitory computer-readable storage media, and removable and non-removable media implemented in any method or technology. Computer-readable storage media includes, but is not limited to, RAM, ROM, erasable programmable ROM ("EPROM"), electrically erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage, other magnetic storage devices, or any other medium that may be used to store the desired information in a non-transitory fashion.

A mass storage device, such as the mass storage device 928 depicted in FIG. 9, may store an operating system utilized to control the operation of the computing device 900. The operating system may comprise a version of the LINUX operating system. The operating system may comprise a version of the WINDOWS SERVER operating system from the MICROSOFT Corporation. According to further aspects, the operating system may comprise a version of the UNIX operating system. Various mobile phone operating systems, such as IOS and ANDROID, may also be utilized. It should be appreciated that other operating systems may also be utilized. The mass storage device 928 may store other system or application programs and data utilized by the computing device 900.

The mass storage device 928 or other computer-readable storage media may also be encoded with computer-executable instructions, which, when loaded into the computing device 900, transforms the computing device from a general-purpose computing system into a special-purpose computer capable of implementing the aspects described herein. These computer-executable instructions transform the computing device 900 by specifying how the CPU(s) 904 transition between states, as described above. The computing device 900 may have access to computer-readable storage media storing computer-executable instructions, which, when executed by the computing device 900, may perform the methods described herein.

A computing device, such as the computing device 900 depicted in FIG. 9, may also include an input/output controller 932 for receiving and processing input from a number of input devices, such as a keyboard, a mouse, a touchpad, a touch screen, an electronic stylus, or other type of input device. Similarly, an input/output controller 932 may provide output to a display, such as a computer monitor, a flat-panel display, a digital projector, a printer, a plotter, or other type of output device. It will be appreciated that the computing device 900 may not include all of the components shown in FIG. 9, may include other components that are not explicitly shown in FIG. 9, or may utilize an architecture completely different than that shown in FIG. 9.

As described herein, a computing device may be a physical computing device, such as the computing device 900 of FIG. 9. A computing node may also include a virtual machine host process and one or more virtual machine instances. Computer-executable instructions may be executed by the physical hardware of a computing device indirectly through interpretation and/or execution of instructions stored and executed in the context of a virtual machine.

It is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Components are described that may be used to perform the described methods and systems. When combinations, subsets, interactions, groups, etc., of these components are described, it is understood that while specific references to each of the various individual and collective combinations and permutations of these may not be explicitly described, each is specifically contemplated and described herein, for all methods and systems. This applies to all aspects of this application including, but not limited to, operations in described methods. Thus, if there are a variety of additional operations that may be performed it is understood that each of these additional operations may be performed with any specific embodiment or combination of embodiments of the described methods.

The present methods and systems may be understood more readily by reference to the following detailed description of preferred embodiments and the examples included therein and to the Figures and their descriptions.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, may be implemented by computer program instructions. These computer program instructions may be loaded on a general-purpose computer, special-purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

The various features and processes described above may be used independently of one another or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto may be performed in other sequences that are appropriate. For example, described blocks or states may be performed in an order other than that specifically described, or multiple blocks or states may be combined in a single block or state. The example blocks or states may be performed in serial, in parallel, or in some other manner. Blocks or states may be added to or removed from the described example embodiments. The example systems and components described herein may be configured differently than described. For example, elements may be added to, removed from, or rearranged compared to the described example embodiments.

It will also be appreciated that various items are illustrated as being stored in memory or on storage while being used, and that these items or portions thereof may be transferred between memory and other storage devices for purposes of memory management and data integrity. Alternatively, in other embodiments, some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), etc.

Some or all of the modules, systems, and data structures may also be stored (e.g., as software instructions or structured data) on a computer-readable medium, such as a hard disk, a memory, a network, or a portable media article to be read by an appropriate device or via an appropriate connection. The systems, modules, and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its operations be performed in a specific order. Accordingly, where a method claim does not actually recite an order to be followed by its operations or it is not otherwise specifically stated in the claims or descriptions that the operations are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as exemplary only, with a true scope and spirit being indicated by the following claims.

What is claimed is:

1. A method of generating voices for virtual characters, comprising:
   receiving a plurality of source sounds, wherein the plurality of source sounds correspond to a plurality of frames of a video, the video comprising a virtual character;
   converting the plurality of source sounds into a plurality of representations in a latent space using a first model, wherein each representation among the plurality of representations comprises a plurality of parameters;
   generating a plurality of sounds for the virtual character in the video in real time as the plurality of source sounds are received based on modifying at least one of the plurality of parameters of each representation in the latent space;
   driving movements of the virtual character in the video by utilizing landmark coordinates generated based on input images by a second model; and
   improving the movements of the virtual character in the video by using the plurality of source sounds as extra input to the second model, wherein the second model is configured to control the movements of the virtual character in the video.

2. The method of claim 1, further comprising:
   encoding the plurality of source sounds to the plurality of representations each of which comprises the plurality of parameters;
   presenting information indicative of the plurality of parameters to a user; and
   generating a plurality of modified representations by modifying the at least one of the plurality of parameters of each representation based on user input.

3. The method of claim 2, further comprising:
   generating the plurality of sounds by decoding the plurality of modified representations to sound signals; and
   outputting the plurality of sounds for the virtual character in a manner that the plurality of sounds are made by the virtual character in the plurality of frames.

4. The method of claim 1, further comprising:
   processing the plurality of source sounds corresponding to the plurality of frames at a predetermined rate.

5. The method of claim 4, wherein the predetermined rate is 30 frames per second.

6. The method of claim 1, further comprising:
   generating a plurality of templates each of which comprises a set of predefined parameters, wherein each of the plurality of templates corresponds to a particular type of sound;
   presenting information indicative of the plurality of templates to a user; and
   generating at least one of the plurality of sounds by applying one of the plurality of templates based on a selection of the one of the plurality of templates by the user.

7. The method of claim 1, further comprising:
   analyzing at least two different sounds selected by a user; and
   recommending a set of parameters for generating a new sound for the virtual character based on the at least two different sounds.

8. The method of claim 7, further comprising:
   modifying the new sound based on user input on at least one of the set of parameters.

9. The method of claim 1, wherein the plurality of sound features comprise pitch, tone, loudness, and duration.

10. A system of generating voices for virtual characters, comprising:
    at least one processor; and
    at least one memory comprising computer-readable instructions that upon execution by the at least one processor cause the system to perform operations comprising:
       receiving a plurality of source sounds, wherein the plurality of source sounds correspond to a plurality of frames of a video, the video comprising a virtual character;
       converting the plurality of source sounds into a plurality of representations in a latent space using a first model, wherein each representation among the plurality of representations comprises a plurality of parameters;
       generating a plurality of sounds in real time for the virtual character in the video in real time as the plurality of source sounds are received based on modifying at least one of the plurality of parameters of each representation in the latent space;
       driving movements of the virtual character in the video by utilizing landmark coordinates generated based on input images by a second model; and
       improving the movements of the virtual character in the video by using the plurality of source sounds as extra input to the second model, wherein the second model is configured to control the movements of the virtual character in the video.

11. The system of claim 10, the operations further comprising:
    encoding the plurality of source sounds to the plurality of representations each of which comprises the plurality of parameters
    presenting information indicative of the plurality of parameters to a user; and
    generating a plurality of modified representations by modifying the at least one of the plurality of parameters of each representation based on user input.

12. The system of claim 11, the operations further comprising:
    generating the plurality of sounds by decoding the plurality of modified representations to sound signals; and
    outputting the plurality of sounds for the virtual character in a manner that the plurality of sounds are made by the virtual character in the plurality of frames.

13. The system of claim 10, the operations further comprising:
    processing the plurality of source sounds corresponding to the plurality of frames at a predetermined rate.

14. The system of claim 10, the operations further comprising:
    generating a plurality of templates each of which comprises a set of predefined parameters, wherein each of the plurality of templates corresponds to a particular type of sound;
    presenting information indicative of the plurality of templates to a user; and
    generating at least one of the plurality of sounds by applying one of the plurality of templates based on a selection of the one of the plurality of templates by the user.

15. The system of claim 10, the operations further comprising:

analyzing at least two different sounds selected by a user; and recommending a set of parameters for generating a new sound for the virtual character based on the at least two different sounds; and modifying the new sound based on user input on at least one of the set of parameters.

16. A non-transitory computer-readable storage medium, storing computer-readable instructions that upon execution by a processor cause the processor to implement operations, the operation comprising:

receiving a plurality of source sounds, wherein the plurality of source sounds correspond to a plurality of frames of a video, the video comprising a virtual character;

converting the plurality of source sounds into a plurality of representations in a latent space using a first model, wherein each representation among the plurality of representations comprises a plurality of parameters;

generating a plurality of sounds for the virtual character in the video in real time as the plurality of source sounds are received based on modifying at least one of the plurality of parameters of each representation in the latent space;

driving movements of the virtual character in the video by utilizing landmark coordinates generated based on input images by a second model; and improving the movements of the virtual character in the video by using the plurality of source sounds as extra input to the second model, wherein the second model is configured to control the movements of the virtual character in the video.

17. The non-transitory computer-readable storage medium of claim 16, the operations further comprising:

encoding the plurality of source sounds to the plurality of representations each of which comprises the plurality of parameters;

presenting information indicative of the plurality of parameters to a user; and generating a plurality of modified representations by modifying the at least one of the plurality of parameters of each representation based on user input.

18. The non-transitory computer-readable storage medium of claim 17, the operations further comprising:

generating the plurality of sounds by decoding the plurality of modified representations to sound signals; and outputting the plurality of sounds for the virtual character in a manner that the plurality of sounds are made by the virtual character in the plurality of frames.

19. The non-transitory computer-readable storage medium of claim 16, the operations further comprising:

generating a plurality of templates each of which comprises a set of predefined parameters, wherein each of the plurality of templates corresponds to a particular type of sound;

presenting information indicative of the plurality of templates to a user; and generating at least one of the plurality of sounds by applying one of the plurality of templates based on a selection of the one of the plurality of templates by the user.

* * * * *